THERMOELECTRIC LEAD TELLURIDE BASE COMPOSITIONS
AND DEVICES UTILIZING THEM

Filed April 2, 1968

INVENTOR
IRWIN KUDMAN
BY Abraham Sherman
ATTORNEY

United States Patent Office 3,460,996
Patented Aug. 12, 1969

3,460,996

THERMOELECTRIC LEAD TELLURIDE BASE COMPOSITIONS AND DEVICES UTILIZING THEM

Irwin Kudman, Trenton, N.J., assignor to Radio Corporation of America, a corporation of Delaware Filed Apr. 2, 1968, Ser. No. 718,120
Int. Cl. H01v 1/18
U.S. Cl. 136—238 4 Claims

ABSTRACT OF THE DISCLOSURE

An N-type thermoelectric composition comprising lead telluride alloyed with germanium telluride and/or germanium selenide. The composition includes an operative amount of a conductivity modifier, such as lead iodide, germanium tetraiodide, lead bromide, germanium tetrabromide, an equimolecular mixture of lead and lead iodide, an equimolecular mixture of lead and lead bromide, an equimolecular mixture of germanium and germanium tetraiodide, and an equimolecular mixture of germanium and germanium tetrabromide.

BACKGROUND OF THE INVENTION

Field of the invention

Figure 1:
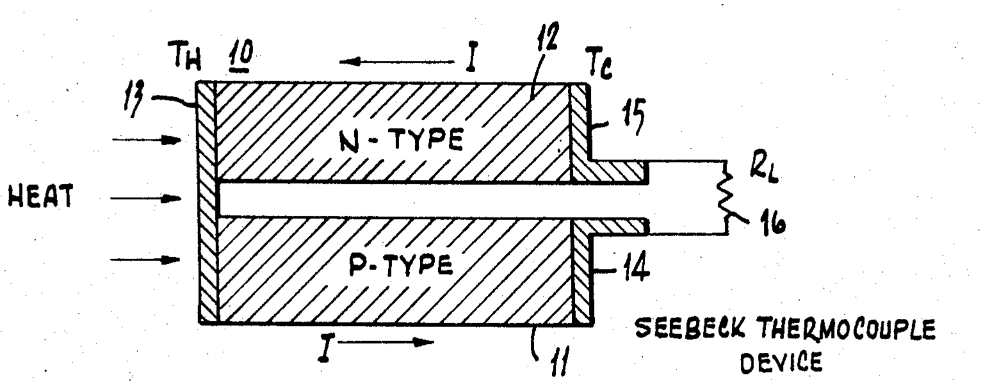

This invention relates generally to improved thermoelectric materials; more particularly, to improved N-type thermoelectric materials, and to improved thermoelectric devices made of these materials.

Description of the prior art

When two rods or wires of dissimilar thermoelectric compositions have their ends joined to form a continuous loop, two thermoelectric junctions are established between the respective ends so joined. If the two junctions are maintained at different temperatures, an electromotive force will be set up in the circuit thus formed. This effect is called the thermoelectric or Seebeck effect, and may be regarded as due to the charge carrier concentration gradient produced by a temperature gradient in the two materials. the effect cannot be ascribed to either material alone, since two dissimilar (thermoelectrically complementary) materials are necessary to obtain the Seebeck effect. The Seebeck effect is utilized in many practical applications, such as the thermocouple thermometer. The Seebeck effect is also important for the transformation of heat energy directly into electrical energy.

Since good thermoelectric materials are near degenerate semiconductors, they may be classed as N-type or P-type, depending on whether the majority carriers in the material are electrons or holes, respectively. The conductivity type of thermoelectric materials may be controlled by adding appropriate acceptor or donor impurity substances which serve as conductivity type modifiers. Whether a particular material is N-type or P-type may be determined by noting the direction of current flow across a junction formed by a circuit member or thermoelement of the particular thermoelectric material and another thermoelement of complementary material when operated as a thermoelectric generator utilizing the Seebeck effect. The direction of the positive (conventional) current at the cold junction will be from the P-type toward the N-type thermoelectric material in the external circuit.

Alloys of lead telluride and germanium telluride have been utilized in Seebeck effect thermoelectric devices. See for example U.S. Patent 3,224,876, issued to R. E. Fredrick on Dec. 21, 1965. However, when these alloys contain as little as about 2 mol percent germanium telluride, the alloys are all P-type as made, even in the absence of an acceptor impurity. These alloys may be made more P-type by the addition of an acceptor impurity such as sodium, potassium, and thallium. Other P-type alloys of lead telluride with at least 85 mol percent germanium telluride have been described which contain small amounts of bismuth or antimony or the tellurides of bismuth or antimony. For details, see U.S. Patent 3,364,-014, issued to R. E. Fredrick on Jan. 16, 1968. Although many P-type alloys of lead telluride and germanium telluride have been described in the literature, satisfactory N-type thermoelectric alloys of these materials have not hitherto been reported to my knowledge.

An object of this invention is to provide improved thermoelectric compositions having improved thermoelectric properties suitable for the direct conversion of thermal energy into electrical energy.

Another object is to provide improved N-type thermoelectric compositions which comprise alloys of lead telluride and germanium telluride and/or germanium selenide.

Still another object of this invention is to provide improved thermoelectric devices capable of efficient operation for the direct conversion of heat energy into electrical energy.

SUMMARY OF THE INVENTION

N-type thermoelectric compositions comprise alloys of about 85 to 99 mol percent lead telluride and 1 to 15 mol percent of germanium telluride and/or germanium selenide. The alloys include donor impurities such as lead iodide, germanium tetraiodide, lead bromide, germanium tetrabromide, an equimolecular mixture of lead and lead iodide, an equimolecular mixture of lead and lead bromide, an equimolecular mixture of germanium and germanium tetraiodide, and an equimolecular mixture of germanium and germanium tetrabromide. The amount of the donor impurity in these alloys is preferably about 0.03 to 0.14 mol percent.

THE DRAWING

Figure 2:
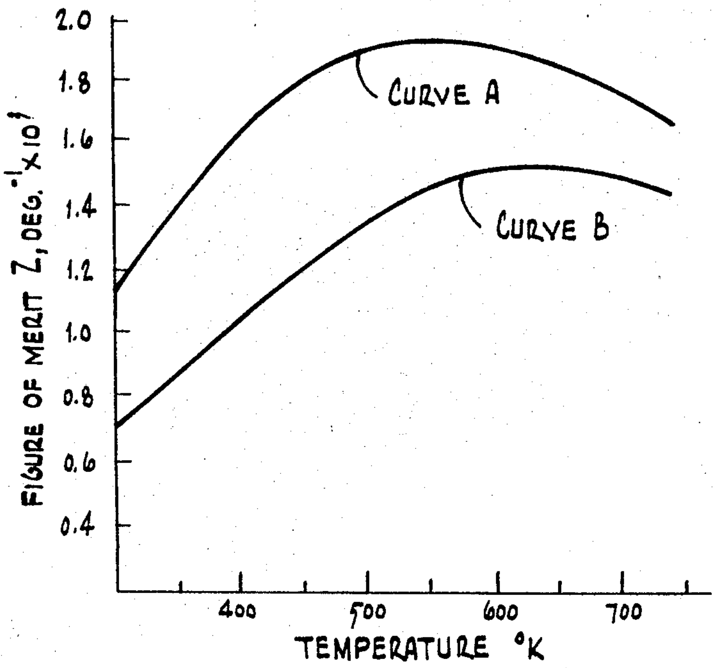

FIG. 1 is a cross-sectional, elevational view of a thermoelectric device according to the invention for the direct transformation of heat energy into electrical energy by means of the Seebeck effect; and, FIG. 2 is a graph showing the variation of the thermoelectric figure of merit Z with temperature for a thermoelectric composition according to the invention.

DESCRIPTION OF THE PREFERRED EMBODIMENTS

There are three fundamental requirements for desirable thermoelectric materials. The first requirement is the development of a high electromotive force per degree difference in temperature between junctions in a circuit containing two thermoelectric junctions. This quality is referred to as Q or the thermoelectric power of the material, and may be defined as $d\theta/dT$, where $d\theta$ is the potential difference induced by a temperature difference $dT$ between two ends of an element made of the material. The thermoelectric power of a material may also be considered as the energy relative to the Fermi level transmitted by a charge carrier along the material per degree temperature difference.

The second requirement is a low thermal conductivity K, since it would be difficult to maintain either high or low temperatuers at a thermoelectric junction, if one or both of the thermoelectric materials conducted heat too readily. High thermal conductivity in a thermoelectric material would reduce the efficiency of the resulting Seebeck or Peltier device.

The third requisite for a good thermoelectric material is high electrical conductivity $\sigma$, or, conversely stated, low electrical resistivity $\rho$. This requisite is apparent since high electrical resistivity would lower the useful electrical power output.

A quantitative approximation of the quality of a thermoelectric material may be made by relating the above three factors Q, K and $\rho$ in a figure of merit Z, which is usually defined as $Z=Q^2/\rho K$, if the properties of the two branches of the thermocouple are the same. Here Q is the thermoelectric power, $\rho$ is the electrical resistivity, and K is the total thermal conductivity. Alternatively, the figure of merit Z may be defined as $\sigma Q^2/K$, where $\sigma$ is the electrical conductivity or reciprocal of $\rho$, and Q and K have the same meaning as above. In semiconductors, the thermoelectric figure of merit can be restated in terms of the requirements of a high charge carrier mobility $\mu$, high effective mass $m^*$ of charge carriers, and low lattice thermal conductivity $K_{ph}$. The thermoelectric figure of merit for semiconductors is approximately equal to $\mu m^{*3/2}/K_{ph}$.

The validity of $Q^2/\rho K$ as a figure of merit for the indication of usefulness of thermoelectric materials for practical applications is well established. Thus, as an objective, high thermoelectric power, low electrical resistivity and low thermal conductivity are desired. These objectives are difficult to attain because materials which are good conductors of electricity are usually good conductors of heat, and the thermoelectric power and electrical resistivity of a material are not independent of each other. For a detailed discussion of the parameters of thermoelectric materials and devices, see F. D. Rosi, E. F. Hockings and N. E. Lindenblad, "Semiconducting Materials for Thermoelectric Power Generation," RCA Review, vol. XXII, pp. 82–121, March 1961.

Example I

A thermoelectric device for the efficient conversion of thermal energy directly into electrical energy by means of the Seebeck effect is illustrated in FIG. 1. The device 10 comprises two different circuit members or thermoelements 11 and 12, which are conductively joined at one end hereinafter denoted the hot junction end, by means of an intermediate member 13. The intermediate member 13 may be in the form of a bus bar or a plate, and is made of a material which is thermally and electrically conductive and has negligible thermoelectric power. Metals and metallic alloys are suitable materials for this purpose. In this example, intermediate member 13 consists of a nickel-plated iron plate. The circuit members or thermoelements 11 and 12 terminate at the end opposite the hot thermoelectric junction in electrical contacts 14 and 15, respectively. The end of thermoelements 11 and 12 adjacent contacts 14 and 15 is hereinafter referred to as the cold junction. The electrical contacts 14 and 15 may for example consist of copper or iron plates which are pressure bonded to the thermoelement.

As indicated above, the two thermoelements 11 and 12 must consist of thermoelectrically complementary materials, that is, one must be P-type and the other must be N-type. In this embodiment, the thermoelement 11 consists of a standard P-type material, such as one of the P-type lead telluride-garmanium telluride alloys mentioned above, and the thermoelement 12 consists of an N-type thermoelectric composition according to the invention comprising about 85 to 99 mol percent lead telluride and 1 to 15 mol percent of at least one compound selected from the group consisting of germanium telluride and germanium selenide.

A specific alloy useful as the N-type thermoelement 12 is prepared as follows. The starting materials are purified germanium, lead, and tellurium, which are all in the form of small solid chunks. Quantities of these materials are weighed to provide a nominal composition of about 95 mol percent lead telluride and about 5 mol percent germanium telluride. About 0.03 to 0.14 mol percent of one of the N-type conductivity modifiers listed above is also weighed out. In this example, the modifier consists of an equimolecular mixture of lead and lead iodide. The amount of lead used in this example is 0.1 mol percent, and the amount of lead iodide used is also 0.1 mol percent. The constituents are all placed in a carbon-coated fused quartz ampoule, which is then evacuated, sealed, and positioned in an electric furnace.

The ampoule and its constituents are heated in the furnace to about 975° C., at which temperature the constituents are all molten. The ampoule is rotated or otherwise mechanically agitated to ensure complete mixing and reaction of the molten constituents. The temperature of the furnace is then lowered to about 825° C., at which temperature the alloy is solidified. The ampoule and its contents are held at that temperature in the furnace for about 100 hours to anneal the solidified alloy. The furnace power is then switched off, and the ampoule and its contents are cooled to room temperature while remaining in the furnace. The N-type alloy thus prepared is cut into the desired shape to form the N-type thermoelement 12 in the device of FIG. 1. The above synthesis may be modified by using purified lead telluride and germanium telluride as starting materials.

The figure of merit Z for this composition, that is, the value of $Q^2/\rho K$, is plotted as a function of temperature in curve A of FIG. 2. For comparison, curve B of FIG. 2 is a similar plot for N-type lead telluride. The N-type composition according to this invention is seen to be superior to the prior art material across the entire measured temperature range. The improvement in the value of Z is reflected in an improvement in the efficiency of devices according to the invention for the conversion of thermal energy into electrical energy.

In the operation of the device 10, the metal plate 13 is heated to a temperature $T_H$, which is suitably about 500° C., and becomes the hot junction of the device. The metal contacts 14 and 15 on the thermoelements 11 and 12, respectively, are maintained at a temperature $T_C$ which is lower than the temperature of the hot junction of the device. The lower or cold junction temperature $T_C$ may, for example, be room temperature. A temperature gradient is thus established in each circuit member 11 and 12 from high adjacent plate 13 to low adjacent contacts 14 and 15 respectively. The electromotive force developed under these conditions produces in the external circuit a flow of (conventional) current I in the direction shown by arrows in FIG. 1, that is, from the P-type thermoelement 12 toward the N-type thermoelement 12. The device is utilized by connecting a load impedance, shown as resistance 16 in the drawing, between the contacts 14 and 15 of thermoelements 11 and 12, respectively.

Example II

In this example, purified lead telluride and germanium selenide in the form of chunks or large granules are weighed in such quantities as to provide a nominal composition of about 95 mol percent lead telluride and about 5 mol percent germanium selenide. The conductivity modifier utilized in this example is germanium tetraiodide, and the amount of this conductivity modifier is about 0.05 mol percent. These constituents are placed in a carbon-coated fused quartz ampoule, which is then evacuated, sealed, and heated in a furnace as described above in Example I to form a homogeneous alloy. The alloy is then solidified and annealed in the furnace for about 100 hours. The N-type composition thus prepared is utilized to fabricate an N-type thermoelement 12 as described above in connection with FIG. 1. When the figure of merit Z for this composition is plotted as a function of temperature, it is found to give a curve very similar to curve A in FIG. 2.

Example III

In the previous examples, the N-type thermoelectric compositions included either germanium telluride or germanium selenide. In the present example, the N-type thermoelectric composition contains both germanium telluride and germanium selenide.

Purified lead telluride in granulated or chunk form, purified germanium telluride, and purified germanium selenide is weighed out in amounts sufficient to provide a nominal composition of about 90 mol percent lead telluride, 5 mol percent germanium telluride and 5 mol percent germanium selenide. About 0.12 mol percent of lead bromide is added to the mixture, which is then placed in a fused quartz ampoule. The ampoule is evacuated, sealed, positioned in a furnace, and subjected to a heating profile similar to that described in Example I. An N-type thermoelectric composition is thus obtained which has properties generally similar to those of the composition of Example I.

There have thus been described improved thermoelectric materials of novel composition which possess advantageous thermoelectric properties and which are easily prepared. The above examples are by way of illustration only, and not by way of limitation. Various modifications may be made by those skilled in the art without departing from the spirit and scope of the invention as set forth in the specification and the appended claims.

I claim:

1. An N-type thermoelectric element comprising an alloy of about 85 to 99 mol percent lead telluride and 1 to 15 mol percent of at least one compound selected from the group consisting of germanium telluride and germanium selenide, said alloy containing 0.03 to 0.14 mol percent of a conductivity modifier selected from the group consisting of lead iodide, germanium tetraiodide, lead bromide, germanium tetrabromide, an equimolecular mixture of lead and lead iodide, an equimolecular mixture of lead and lead bromide, an equimolecular mixture of germanium and germanium tetraiodide, and an equimolecular mixture of germanium and germanium tetrabromide, the total mole percentage in said alloy being equal to 100.

2. An N-type thermoelectric element comprising an alloy of about 95 mol percent lead telluride, about 5 mol percent germanium telluride, and about 0.03 to 0.14 mol percent of a conductivity modifier selected from the group consisting of lead iodide, germanium tetraiodide, lead bromide, germanium tetrabromide, an equimolecular mixture of lead and lead iodide, an equimolecular mixture of lead and lead bromide, an equimolecular mixture of germanium and germanium tetraiodide, and an equimolecular mixture of germanium and germanium tetrabromide, the total mole percentage in said alloy being equal to 100.

3. A thermoelectric device comprising two thermoelectric circuit members, one said member being N-type and the other said member being P-type, said members being conductively joined to form a thermoelectric junction, said N-type member comprising an alloy of about 85 to 99 mol percent lead telluride and 1 to 15 mol percent of at least one compound preferably selected from the group consisting of germanium telluride and germanium selenide, said N-type alloy containing 0.03 to 0.14 mol percent of a conductivity modifier selected from the group consisting of lead iodide, germanium tetraiodide, lead bromide, germanium tetrabromide, an equimolecular mixture of lead and lead iodide, an equimolecular mixture of lead and lead bromide, an equimolecular mixture of germanium and germanium tetraiodide, and an equimolecular mixture of germanium and germanium tetrabromide, the total mole percentage in said alloy being equal to 100.

4. A thermoelectric device comprising two thermoelectric circuit members, one said member being P-type and the other said member being N-type, said members being conductively joined to form a thermoelectric junction, said N-type member comprising an alloy of about 95 mol percent lead telluride, 5 mol percent germanium telluride, 0.1 mol percent of lead, and 0.1 mol percent of lead iodide, the total mole percentage in said alloy being equal to 100.

References Cited

UNITED STATES PATENTS

| | | | |
|---|---|---|---|
| 2,811,440 | 10/1957 | Fritts et al. | 136—238 X |
| 2,811,571 | 10/1957 | Fritts et al. | 136—238 |
| 2,896,005 | 7/1959 | Fritts et al. | 136—238 X |
| 3,045,057 | 7/1962 | Cornish | 136—238 |
| 3,075,031 | 1/1963 | Hockings et al. | 136—238 |
| 3,211,656 | 10/1965 | Rupprecht | 136—238 X |
| 3,224,876 | 12/1965 | Fredrick | 136—236 X |
| 3,364,014 | 1/1968 | Fredrick | 136—238 X |

ALLEN B. CURTIS, Primary Examiner

A. BEKELMAN, Assistant Examiner

U.S. Cl. X.R.

75—166; 136—239; 252—62